United States Patent
Nitta

(10) Patent No.: US 11,211,523 B2
(45) Date of Patent: Dec. 28, 2021

(54) METHOD FOR MANUFACTURING OPTICAL SEMICONDUCTOR DEVICE

(71) Applicant: SUMITOMO ELECTRIC INDUSTRIES, LTD., Osaka (JP)

(72) Inventor: Toshiyuki Nitta, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 24 days.

(21) Appl. No.: 16/938,080

(22) Filed: Jul. 24, 2020

(65) Prior Publication Data

US 2021/0036181 A1 Feb. 4, 2021

(30) Foreign Application Priority Data

Jul. 31, 2019 (JP) .............................. JP2019-141508

(51) Int. Cl.
*H01L 33/00* (2010.01)
(52) U.S. Cl.
CPC .. *H01L 33/0093* (2020.05); *H01L 2933/0058* (2013.01)

(58) Field of Classification Search
None
See application file for complete search history.

(56) References Cited

U.S. PATENT DOCUMENTS

2019/0097034 A1* 3/2019 Nakata ............. H01L 29/66969
2019/0285964 A1 9/2019 Takenaka et al.

FOREIGN PATENT DOCUMENTS

JP 2018-028608 A 2/2018

* cited by examiner

*Primary Examiner* — Robert K Carpenter
(74) *Attorney, Agent, or Firm* — Volpe Koenig

(57) ABSTRACT

A method for manufacturing an optical semiconductor device includes the steps of bonding a chip including a first substrate and a compound semiconductor layer disposed on the first substrate to a second substrate including silicon such that the compound semiconductor layer faces the second substrate; after the step of bonding the chip, etching the first substrate; after the etching step, forming a resist having a residue of the first substrate exposed therefrom and covering the compound semiconductor layer and the second substrate; and after the step of forming the resist, etching the residue.

7 Claims, 3 Drawing Sheets

ID OF MANUFACTURING OPTICAL
METHOD FOR MANUFACTURING OPTICAL SEMICONDUCTOR DEVICE

CROSS-REFERENCE TO RELATED APPLICATION

This application is based upon and claims the benefit of priority of the prior Japanese Patent Application No. 2019-141508, filed on Jul. 31, 2019, the entire contents of which are incorporated herein by reference.

BACKGROUND OF THE INVENTION

1. Field of the Invention

The present invention relates to methods for manufacturing optical semiconductor devices.

2. Description of the Related Art

There is a known technique for manufacturing an optical semiconductor device by bonding a chip obtained from a compound semiconductor substrate and including a device such as a light-emitting device to a silicon wafer having a waveguide formed thereon (see, for example, Japanese Unexamined Patent Application Publication No. 2018-28608).

SUMMARY OF THE INVENTION

After the chip is bonded, the substrate of the chip is removed, for example, by etching. However, a portion of the substrate may remain after the etching. Accordingly, an object of the present invention is to provide a method for manufacturing an optical semiconductor device in which an etching residue can be removed.

A method for manufacturing an optical semiconductor device according to one aspect of the present invention includes the steps of bonding a chip including a first substrate and a compound semiconductor layer disposed on the first substrate to a second substrate including silicon such that the compound semiconductor layer faces the second substrate; after the step of bonding the chip, etching the first substrate; after the etching step, forming a resist having a residue of the first substrate exposed therefrom and covering the compound semiconductor layer and the second substrate; and after the step of forming the resist, etching the residue.

DESCRIPTION OF THE PREFERRED EMBODIMENTS

Description of Embodiments of the Invention

Figure 1A:
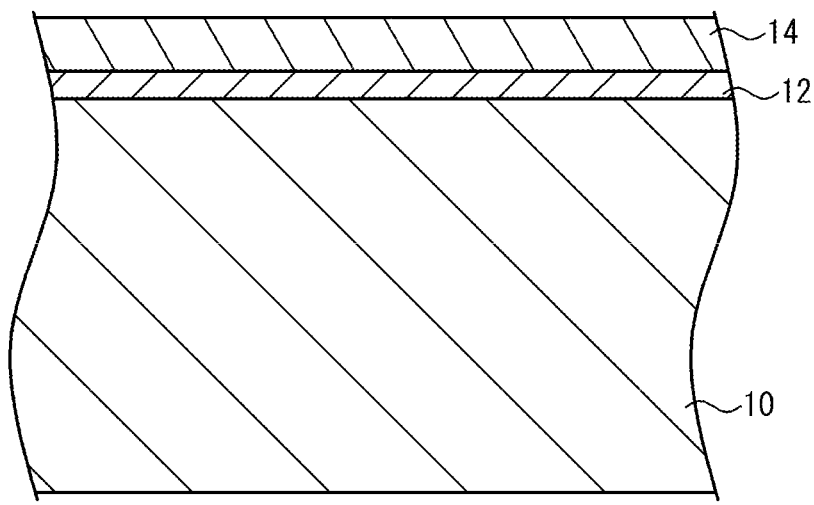
FIG. 1A is a sectional view showing an example method for manufacturing an optical semiconductor device according to one embodiment.

First, embodiments of the present invention will be listed and described.

(1) One embodiment of the present invention is a method for manufacturing an optical semiconductor device, including the steps of bonding a chip including a first substrate and a compound semiconductor layer disposed on the first substrate to a second substrate including silicon such that the compound semiconductor layer faces the second substrate; after the step of bonding the chip, etching the first substrate; after the etching step, forming a resist having a residue of the first substrate exposed therefrom and covering the compound semiconductor layer and the second substrate; and after the step of forming the resist, etching the residue. The removal of the residue by etching can reduce the likelihood of damage to the optical semiconductor device due to debris resulting from the residue and can also reduce a decrease in the accuracy of the steps subsequent to the etching.

(2) The etchant used in the step of etching the first substrate may be hydrochloric acid, and the etchant used in the step of etching the residue may include hydrochloric acid, acetic acid, and hydrogen peroxide. When strongly anisotropic etching is performed with hydrochloric acid, a residue occurs. Isotropic or weakly anisotropic etching is then performed with an etchant including hydrochloric acid, acetic acid, and hydrogen peroxide. Thus, the residue is removed.

(3) The first substrate and the compound semiconductor layer may include indium phosphide. When the indium phosphide first substrate is etched, a residue remains. The indium phosphide residue can be removed by etching.

(4) The first substrate may have a thickness of 30 μm or more and 50 μm or less after a step of lapping the first substrate. If the thickness is 30 μm or more, damage due to lapping is unlikely to reach the compound semiconductor layer, and the chip is also unlikely to come off the second substrate. If the thickness is 50 μm or less, the height of the residue is also 50 μm or less. Thus, the residue can be easily removed by etching.

(5) The resist may have a thickness of 5 μm or more and 10 μm or less. If the thickness is 5 μm or more, the resist can cover the chip and the second substrate. If the thickness is 10 μm or less, the residue is exposed from the resist.

(6) The method may further include a step of lapping the first substrate after the step of bonding the chip and before the step of etching the first substrate. Damage due to lapping can be removed by etching.

(7) The chip may further include an etching stop layer disposed between the first substrate and the compound semiconductor layer. The etching stop layer may include indium gallium arsenide. Thus, the compound semiconductor layer can be left without being etched.

DETAILS OF EMBODIMENTS OF THE INVENTION

A specific example of a method for manufacturing an optical semiconductor device according to one embodiment of the present invention will hereinafter be described with reference to the drawings. It should be understood, however, that the invention is not limited to this example, but is indicated by the claims, and all changes that come within the meaning and range of equivalency of the claims are intended to be embraced therein.

First Embodiment

In a first embodiment, an optical semiconductor device is formed by bonding a chip including a compound semiconductor layer to a wafer having a waveguide formed thereon. FIGS. 1A to 2B and FIGS. 3A to 3D are sectional views showing an example method for manufacturing an optical semiconductor device according to the first embodiment. FIG. 2C is a plan view showing the example method for manufacturing an optical semiconductor device.

As shown in FIG. 1A, an etching stop layer 12 and a compound semiconductor layer 14 are epitaxially grown in sequence on a substrate 10 (first substrate) in wafer form, for example, by metal-organic vapor phase epitaxy (MOVPE) or molecular beam epitaxy (MBE).

The substrate 10 is, for example, a semiconductor substrate formed of indium phosphide (InP). The etching stop layer 12 is formed of, for example, indium gallium arsenide (InGaAs). The compound semiconductor layer 14 is formed of, for example, InP and indium gallium arsenide phosphide (InGaAsP) and includes, for example, an active layer and cladding layers. The substrate 10 has a thickness of, for example, 350 µm. The etching stop layer 12 and the compound semiconductor layer 14 have a total thickness of, for example, 3 µm.

After the epitaxial growth, the substrate 10 is polished to a thickness T1 of, for example, about 200 µm. The substrate 10 is cut into a plurality of chips 16 (described later), for example, by dicing.

Figure 1B:
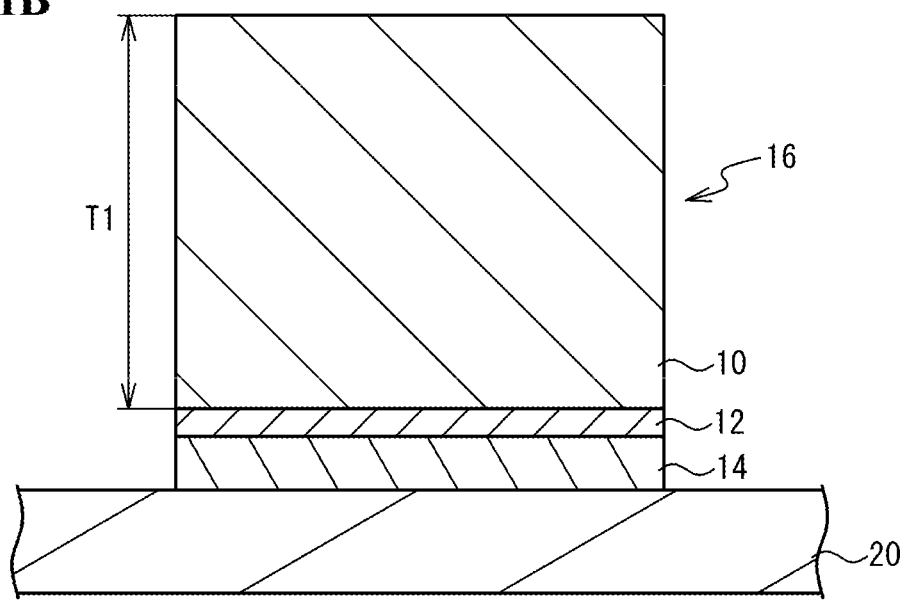
FIG. 1B is a sectional view showing the example method for manufacturing an optical semiconductor device according to the embodiment.

A substrate 20 (second substrate) shown in FIG. 1B is, for example, a silicon-on-insulator (SOI) substrate including silicon (Si), silicon oxide ($SiO_2$), and Si layers stacked on top of each other. The substrate 20 is in wafer form and has formed on a surface thereof, for example, an optical circuit such as a waveguide, a ring resonator, or a distributed Bragg reflector (DBR) (diffraction grating). Each of the plurality of chips 16 cut from the substrate 10 is bonded to the substrate 20. Specifically, bonding is accomplished, for example, by activating the surface of the compound semiconductor layer 14 of the chip 16 and the surface of the substrate 20 with plasma, bringing the compound semiconductor layer 14 into contact with the substrate 20, and pressing them together.

Figure 2A:
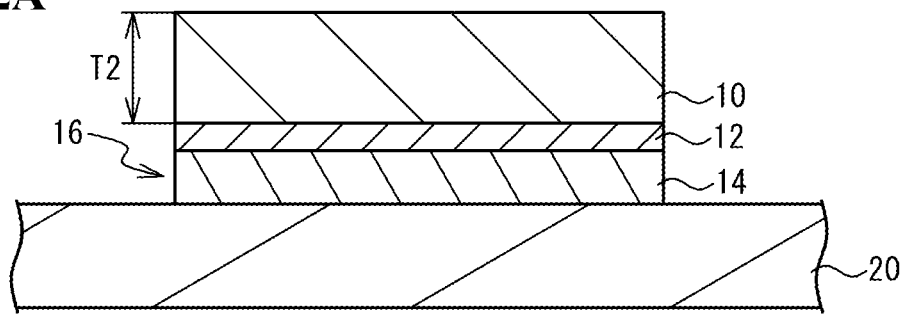
FIG. 2A is a sectional view showing the example method for manufacturing an optical semiconductor device according to the embodiment.

As shown in FIG. 2A, the substrate 10 is lapped and thinned. The thickness T2 of the substrate 10 after the lapping is, for example, 30 µm or more and 50 µm or less. If the substrate 10 is too thin, the chip 16 easily comes off the substrate 20. In addition, damage such as fracture due to lapping may reach the etching stop layer 12 and the compound semiconductor layer 14. Thus, the thickness T2 after the lapping is preferably 30 µm or more. On the other hand, if the substrate 10 is too thick, high protrusions remain after etching, described later. Such protrusions are difficult to remove. Thus, the thickness T2 is preferably 50 µm or less. The substrate 10 is preferably thinned by lapping because other thinning methods such as back grinding may cause the chip 16 to come off the substrate 20.

Figure 2B:
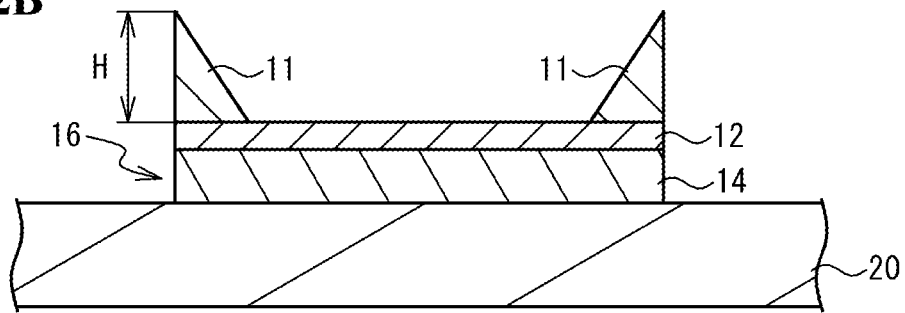
FIG. 2B is a sectional view showing the example method for manufacturing an optical semiconductor device according to the embodiment.
Figure 2C:
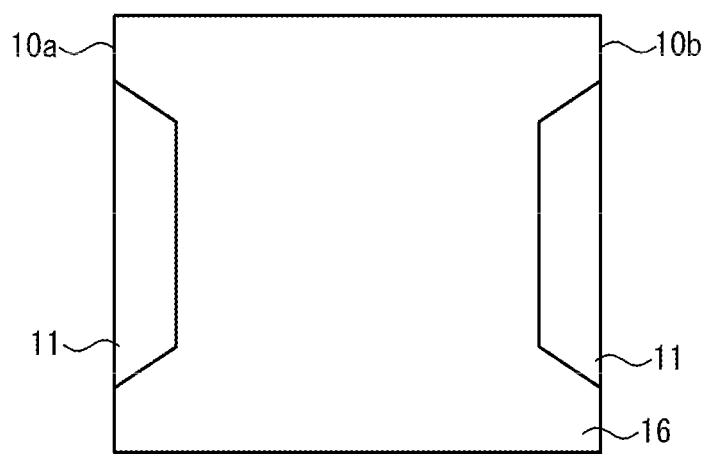
FIG. 2C is a plan view showing the example method for manufacturing an optical semiconductor device.

As shown in FIG. 2B, the substrate 10 is removed by wet etching using hydrochloric acid (HCl) as an etchant. The etching also removes damage due to lapping. Because of high etching selectivity, the InP substrate 10 is etched, whereas the InGaAs etching stop layer 12 is not etched. Thus, the etching stop layer 12 and the underlying compound semiconductor layer 14 remain after the etching. The substrate 20 is also not etched. Because this etching is anisotropic, the etching rate varies depending on the crystal orientation of the substrate 10. Accordingly, the substrate 10 is more easily etched in the center thereof and is less easily etched at the ends thereof. Thus, protrusions 11 (residues) remain at the ends of the substrate 10. The height H of the protrusions 11 is, for example, similar to the thickness T2, i.e., 30 to 50 µm.

FIG. 2C shows the chip 16 after the etching. If the etching stop layer 12 is formed on the (100) plane of the InP substrate 10, as shown in FIG. 2C, two protrusions 11 extend along sides 10a and 10b of the substrate 10. One of the sides 10a and 10b extends in the [01-1] direction, whereas the other side extends in the [0-11] direction. The inclined surface of one of the two protrusions 11 is the (11-1) plane, whereas the inclined surface of the other protrusion 11 is the (1-11) plane. No protrusions 11 remain at the other sides or in the center.

The protrusions 11 may decrease the accuracy of resist patterning in the subsequent steps and may also cause other problems such as defects in a resist pattern. In addition, debris resulting from the protrusions 11 may damage the chip 16 and the substrate 20. Accordingly, in the first embodiment, the protrusions 11 are removed.

Figure 3A:
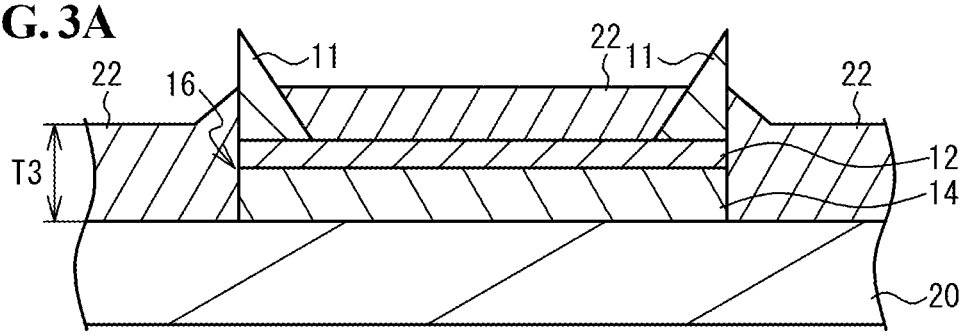
FIG. 3A is a sectional view showing the example method for manufacturing an optical semiconductor device according to the embodiment.

As shown in FIG. 3A, a resist 22 is applied to the substrate 20 and the chip 16. The resist 22 is, for example, an etching-resistant resin. The resist 22 is patterned by exposure and development. The resist 22 covers the surfaces of the substrate 20 and the chip 16, with the protrusions 11 exposed from the resist 22. If the resist 22 is deposited on the protrusions 11, the unnecessary resist 22 is removed, for example, by exposure and development. Except for the protrusions 11, the substrate 20 and the chip 16 have surface irregularities with heights of, for example, about 3 µm. Thus, the thickness T3 of the resist 22 is preferably greater than the heights of the surface irregularities. On the other hand, the thickness T3 is preferably smaller than the height H so that the protrusions 11 protrude out of the resist 22. The thickness T3 of the resist 22 is, for example, 5 µm or more and 10 µm or less.

Figure 3B:
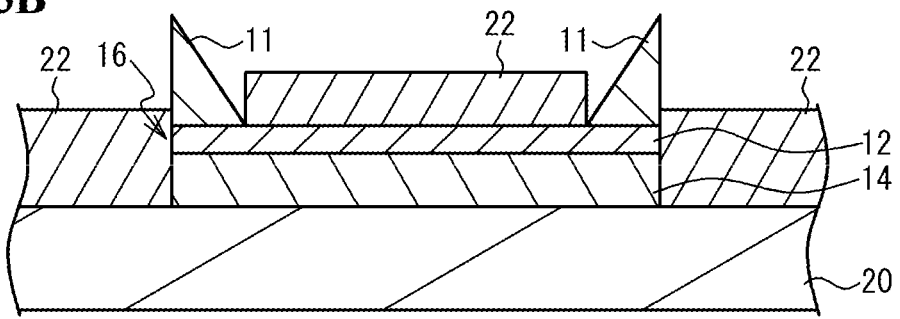
FIG. 3B is a sectional view showing the example method for manufacturing an optical semiconductor device according to the embodiment.
Figure 3C:
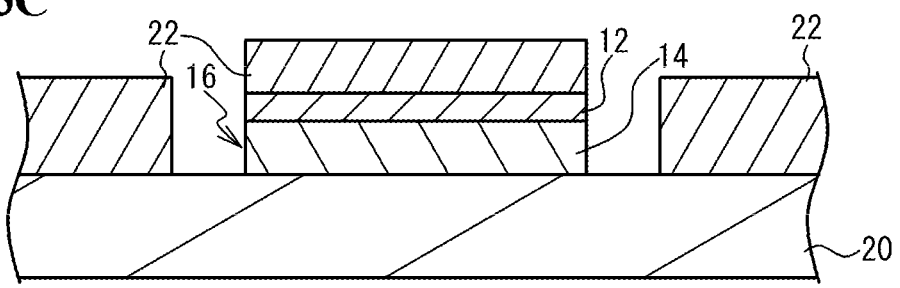
FIG. 3C is a sectional view showing the example method for manufacturing an optical semiconductor device according to the embodiment.

As shown in FIG. 3B, baking is performed, for example, at 110° C. for 10 minutes or more to facilitate the polymerization reaction of the resist 22 and to evaporate any volatile components. After the baking, wet etching is performed, for example, using a mixture of hydrochloric acid (HCl), acetic acid ($CH_3COOH$), and hydrogen peroxide ($H_2O_2$) as an etchant. As shown in FIG. 3C, the wet etching removes the protrusions 11 and the underlying portions of the etching stop layer 12 and the compound semiconductor layer 14. The use of the above etchant permits isotropic or weakly anisotropic etching so that the protrusions 11 can be removed. The portion of the chip 16 under the resist 22 and the substrate 20 are not etched.

Figure 3D:
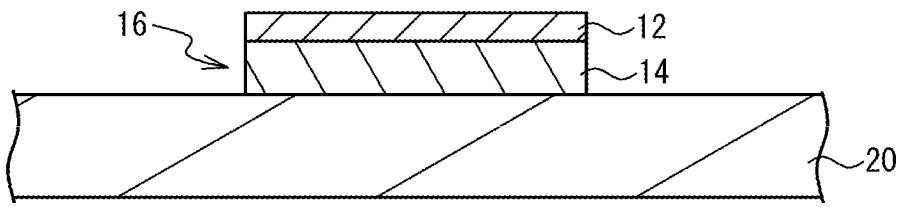
FIG. 3D is a sectional view showing the example method for manufacturing an optical semiconductor device according to the embodiment.

As shown in FIG. 3D, after the etching, the resist 22 is removed, for example, with acetone or a stripping solution. The chip 16 is subjected to photolithography and etching to form, for example, a mesa, and electrodes and insulating films are further formed. In this way, an optical semiconductor device is formed. The chip 16 functions as, for example, an active device such as a light-emitting device, and light emitted from the chip 16 propagates through the waveguide in the substrate 20.

In the first embodiment, the chip 16 is bonded to the substrate 20, and the substrate 10 is etched. After the etching, the protrusions 11 remain on the chip 16. The protrusions 11 can be removed by performing etching again.

The etching of the protrusions 11 reduces the likelihood of damage due to debris resulting from the protrusions 11 and also reduces a decrease in the accuracy of processes such as photolithography in the subsequent steps. Before the etching, the resist 22 is provided on the chip 16. The protrusions 11 are exposed from the resist 22, and the portion of the chip 16 that does not overlap the protrusions 11 is covered by the resist 22. Thus, the protrusions 11 and the underlying portions are etched, and the likelihood of damage to the compound semiconductor layer 14 or other component of the chip 16 is reduced.

The etchant used in the etching of the substrate 10 is, for example, HCl. Because this etchant is anisotropic, the etching rate is higher in the center of the substrate 10 and is lower at the sides 10a and 10b of the substrate 10. Thus, the protrusions 11 remain along the sides 10a and 10b. The etchant used in the etching of the protrusions 11 is, for example, a mixture of HCl, $CH_3COOH$, and $H_2O_2$. Because this etching is isotropic or weakly anisotropic, the etching rate is also high at the sides 10a and 10b. Thus, the protrusions 11 can be effectively removed.

The substrate 10 and the compound semiconductor layer 14 include InP. The etching rate varies depending on the crystal orientation of InP. Thus, the protrusions 11 remain. The InP protrusions 11 can be removed by performing etching again.

The thickness T2 of the substrate 10 after the lapping is, for example, 30 μm or more and 50 μm or less. Because the thickness T2 is 30 μm or more, fracture due to lapping, for example, is unlikely to reach the etching stop layer 12 and the compound semiconductor layer 14. In addition, the chip 16 is unlikely to come off the substrate 20. Because the thickness T2 is 50 μm or less, the height H of the protrusions 11 is also 50 μm or less. Thus, the protrusions 11 can be easily removed by etching.

The thickness T3 of the resist 22 is, for example, 5 μm or more and 10 μm or less. Because the thickness T3 is 5 μm or more, the resist 22 can cover the chip 16 and the substrate 20, including surface irregularities. Because the thickness T3 is 10 μm or less, the protrusions 11 are exposed from the resist 22. Thus, the protrusions 11 can be removed by etching.

If the protrusions 11 are high, a protective film may be formed on the substrate 20 and the chip 16 before the resist 22 is applied thereto. The protective film is, for example, a thin inorganic film resistant to etchant, such as a SiN or $SiO_2$ film. After the protective film is formed, the resist 22 is applied to the protective film and is patterned by exposure and development, and the pattern of the resist 22 is transferred to the protective film, for example, with buffered hydrofluoric acid (BHF). The resist 22 and the protective film cover the surfaces of the substrate 20 and the chip 16, with the protrusions 11 exposed from the resist 22 and the protective film. After baking, the protrusions 11 and the underlying portions of the etching stop layer 12 and the compound semiconductor layer 14 are removed by wet etching. Although the wet etching takes a longer time if the protrusions 11 are high, the use of the protective film reliably protects the portion other than the protrusions 11 from the etchant.

After the chip 16 is bonded, the substrate 10 is lapped and thinned. By performing etching thereafter, damage due to lapping can be removed. The substrate 10 is preferably thinned by lapping. Lapping induces a smaller shear stress in the chip 16 than back grinding. Thus, the likelihood of the chip 16 coming off can be reduced.

The InGaAs etching stop layer 12 is disposed between the substrate 10 and the compound semiconductor layer 14. Because the etching of the substrate 10 stops at the etching stop layer 12, the etching of the compound semiconductor layer 14 is inhibited, and the compound semiconductor layer 14 remains. The substrate 10, the etching stop layer 12, and the compound semiconductor layer 14 may be formed of semiconductors other than those mentioned in the first embodiment. If residues like the protrusions 11 occur because the etching of the substrate 10 is anisotropic, the resist 22 may be provided, and the residues may be removed by etching.

Although certain embodiments of the present invention have been described in detail above, the invention is not limited to these embodiments. Rather, various changes and modifications can be made within the spirit of the invention as set forth in the claims.

What is claimed is:

1. A method for manufacturing an optical semiconductor device, comprising the steps of:
   bonding a chip including a first substrate and a compound semiconductor layer disposed on the first substrate to a second substrate including silicon such that the compound semiconductor layer faces the second substrate;
   after the step of bonding the chip, etching the first substrate;
   after the etching step, forming a resist having a residue of the first substrate exposed therefrom and covering the compound semiconductor layer and the second substrate; and
   after the step of forming the resist, etching the residue.

2. The method for manufacturing an optical semiconductor device according to claim 1, wherein
   an etchant used in the step of etching the first substrate is hydrochloric acid, and
   an etchant used in the step of etching the residue includes hydrochloric acid, acetic acid, and hydrogen peroxide.

3. The method for manufacturing an optical semiconductor device according to claim 1, wherein the first substrate and the compound semiconductor layer include indium phosphide.

4. The method for manufacturing an optical semiconductor device according to claim 1, wherein the first substrate has a thickness of 30 μm or more and 50 μm or less after a step of lapping the first substrate.

5. The method for manufacturing an optical semiconductor device according to claim 1, wherein the resist has a thickness of 5 μm or more and 10 μm or less.

6. The method for manufacturing an optical semiconductor device according to claim 1, further comprising a step of lapping the first substrate after the step of bonding the chip and before the step of etching the first substrate.

7. The method for manufacturing an optical semiconductor device according to claim 1, wherein the chip further includes an etching stop layer disposed between the first substrate and the compound semiconductor layer, the etching stop layer including indium gallium arsenide.

\* \* \* \* \*